United States Patent [19]
Burke

[11] Patent Number: 5,805,420
[45] Date of Patent: Sep. 8, 1998

[54] MOUNTING ASSEMBLY FOR REMOVABLE INSTALLATION OF ELECTRONIC COMPONENTS INTO A HOUSING

[75] Inventor: Jonathan C. Burke, Corte Madera, Calif.

[73] Assignee: Scitex Digital Video, Inc., Redwood City, Calif.

[21] Appl. No.: 928,175

[22] Filed: Sep. 12, 1997

Related U.S. Application Data

[63] Continuation of Ser. No. 629,445, Apr. 9, 1996, abandoned.

[51] Int. Cl.$^6$ .................................. G06F 1/16; H05K 7/10
[52] U.S. Cl. .......................................... 361/727; 361/725
[58] Field of Search .................................. 361/684, 695, 361/686, 724–727; 364/708.1; G06F 1/16

[56] References Cited

U.S. PATENT DOCUMENTS

| | | | |
|---|---|---|---|
| 4,754,397 | 6/1988 | Varaiya et al. | 364/200 |
| 4,960,384 | 10/1990 | Singer et al. | 439/155 |
| 5,229,919 | 7/1993 | Chen | 361/725 |
| 5,269,698 | 12/1993 | Singer | 439/157 |
| 5,277,615 | 1/1994 | Hastings et al. | 439/377 |
| 5,325,263 | 6/1994 | Singer et al. | 361/683 |
| 5,557,499 | 9/1996 | Reiter et al. | 361/725 |

*Primary Examiner*—Lynn D. Feild
*Attorney, Agent, or Firm*—Limbach & Limbach L.L.P.

[57] ABSTRACT

A mounting assembly for use in mounting electronic components into a housing. The mounting assembly includes a plate mounted in spaced relation to a wall of the housing, and a catch formed in the wall near the plate. An electronic component carrier is slidably mountable to the plate. The carrier has a fully removed condition in which the carrier is separated from the plate and an installed condition in which the carrier is mounted to the plate and is within the housing. A latch member is hinged to the carrier and is pivotable relative to the carrier between an opened condition in which the latch member extends longitudinally from the carrier and a closed condition in which the latch member extends angularly from the carrier. When the carrier is in the installed condition and the latch member is pivoted to the closed condition, the latch member engages with the latch to lock the electronic component into place within the housing. The electronic component may be removed from the housing by pivoting the latch member to the opened condition to cause the latch member to disengage from the catch.

1 Claim, 10 Drawing Sheets

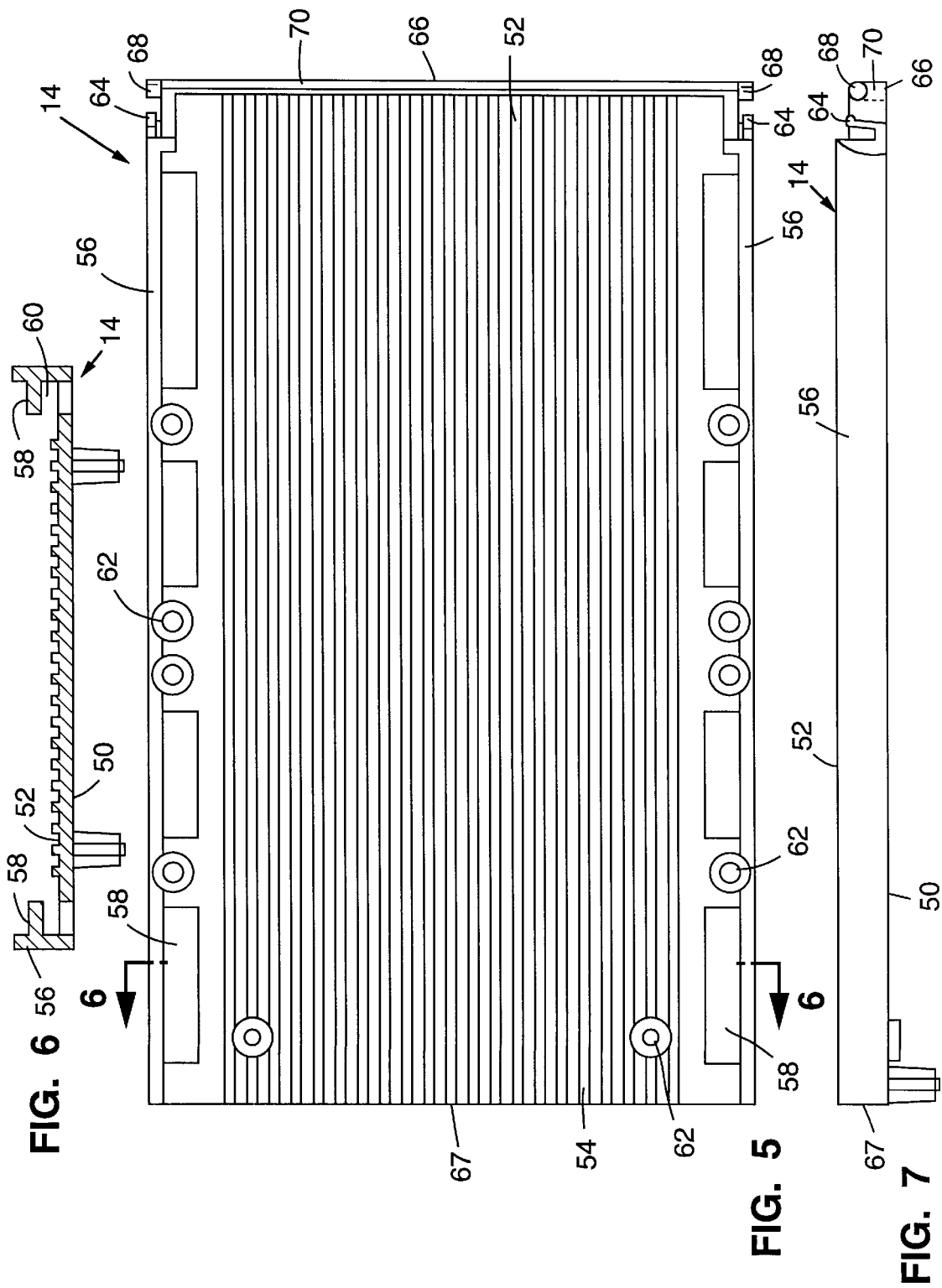

MOUNTING ASSEMBLY FOR REMOVABLE INSTALLATION OF ELECTRONIC COMPONENTS INTO A HOUSING

This is a continuation of application Ser. No. 08/629,445 filed on Apr. 9, 1996, now abandoned.

FIELD OF THE INVENTION

The present invention relates generally to the field of apparatuses for housing computer components. It relates particularly to an apparatus for releasably retaining disk drives and other electronic components in a housing.

BACKGROUND OF THE INVENTION

Apparatuses which permit easy removal and replacement of electronic components, such as hard disk drives, into computer housings are desirable. Such apparatuses help to increase the memory capacity of computers by allowing computer users to access data stored on multiple hard disk drives and by permitting hard disk drives to be moved between computers. Using such devices, one or more hard disk drives may be releasably installed in a main computer housing (which also houses the computer's CPU), or in a housing which is separate from the main computer housing but which is electronically connected to the main processor (CPU).

Prior art devices which facilitate installation and removal of electronic components include relatively complex mechanical components, such as rack and pinion systems. While such mechanisms satisfactorily permit removable installation of disk drives into their corresponding housings, they are expensive to manufacture and they can consume large amounts of space inside the housings. Cheaper and less space-consuming alternatives are therefore desirable.

It is therefore an object of the present invention to provide an apparatus which permits easy installation of a disk drive or other electronic component into a corresponding housing, which further permits easy removal of such components from the housing, which is inexpensive to manufacture, and which does not occupy a great deal of space within the housing.

SUMMARY OF THE INVENTION

The present invention is a simple mounting assembly for use in mounting electronic components (such as hard disk drives, optical disk drives, and other components) into a housing. The mounting assembly includes a plate mounted in spaced relation to a wall of the housing, and a catch formed in the wall near the plate.

A carrier, to which an electronic component is to be attached, is slidably mountable to the plate. The carrier has a fully removed condition in which the carrier is separated from the plate and an installed condition in which the carrier is mounted to the plate and is within the housing.

A latch member is hinged to the carrier and is pivotable relative to the carrier between an opened condition in which the latch member extends longitudinally from the carrier and a closed condition in which the latch member extends angularly from the carrier. When the carrier is in the installed condition and the latch member is pivoted to the closed condition, the latch member engages with the catch to lock the electronic component into place within the housing. The electronic component may be removed from the housing by pivoting the latch member to the opened condition to cause the latch member to disengage from the catch.

BRIEF DESCRIPTION OF THE DRAWINGS

FIG. 5 is a bottom plan view of a carrier of the mounting assembly of FIG. 1.

FIG. 6 is a cross-section view of the carrier of FIG. 5, taken along the plane designated 6—6 in FIG. 5.

FIG. 7 is a side elevation view of the carrier of FIG. 5.

In FIG. 11A, the paddle is in the closed condition. In FIG. 11B the paddle is in the opened condition.

DETAILED DESCRIPTION OF A PREFERRED EMBODIMENT

A preferred embodiment of the present invention is a disk drive tower which includes a housing, and which permits installation of multiple hard disk drives, or other components, into the housing, with the drives arranged vertically with respect to one another. However, it should be appreciated that the mounting assembly of the present invention may be used for permitting removable installation of disk drives or other electronic components into other types of housings such as the main computer housings provided with personal computers.

Figure 1:
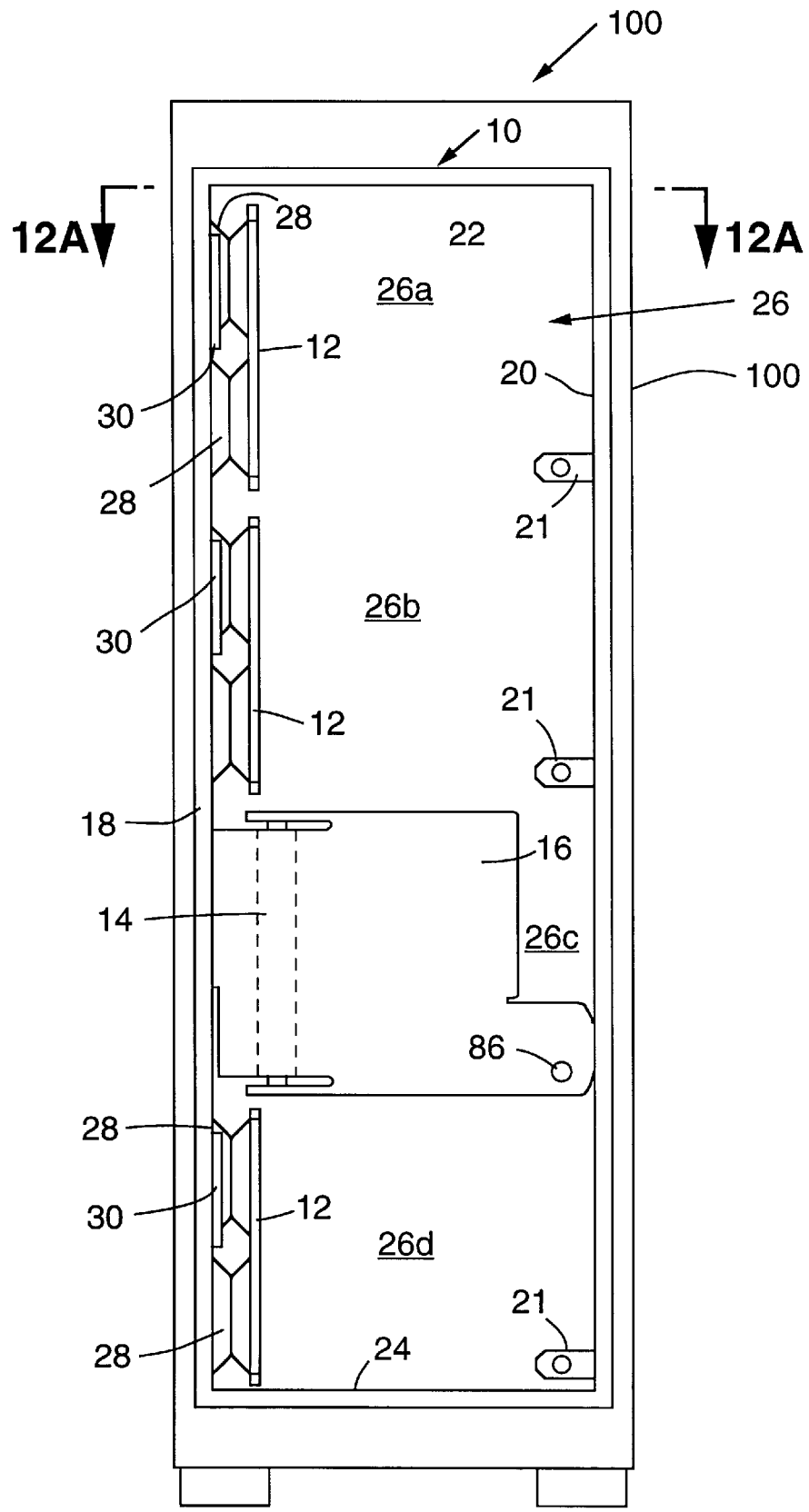
FIG. 1 is a front elevation view showing the mounting assembly according to the present invention inside a housing sized and shaped for housing one or more disk drives.

Referring to FIG. 1, the present invention is comprised generally of a chassis 10 within the housing 100, a plurality of plates 12 fixedly attached within the chassis 10 and spaced from one of the chassis walls, a plurality of carriers 14 (one shown in FIG. 1) each of which is attachable to a disk drive (not shown) or other electronic component and each of which is engageable with one of the plates 12, and a plurality of paddles 16 (one shown) which are each hinged to a respective one of the carriers 14.

Chassis 10 is a substantially rectangular housing having opposing side walls 18, 20, a top wall 22 and a bottom wall 24. Together the walls 18, 20, 22, 24 define a chamber 26.

As can be seen in FIG. 1, chamber 26 includes four disk drive locations, designated 26a–26d, which are arranged vertically with respect to each other and which are each configured to receive a separate disk drive.

Figure 2:
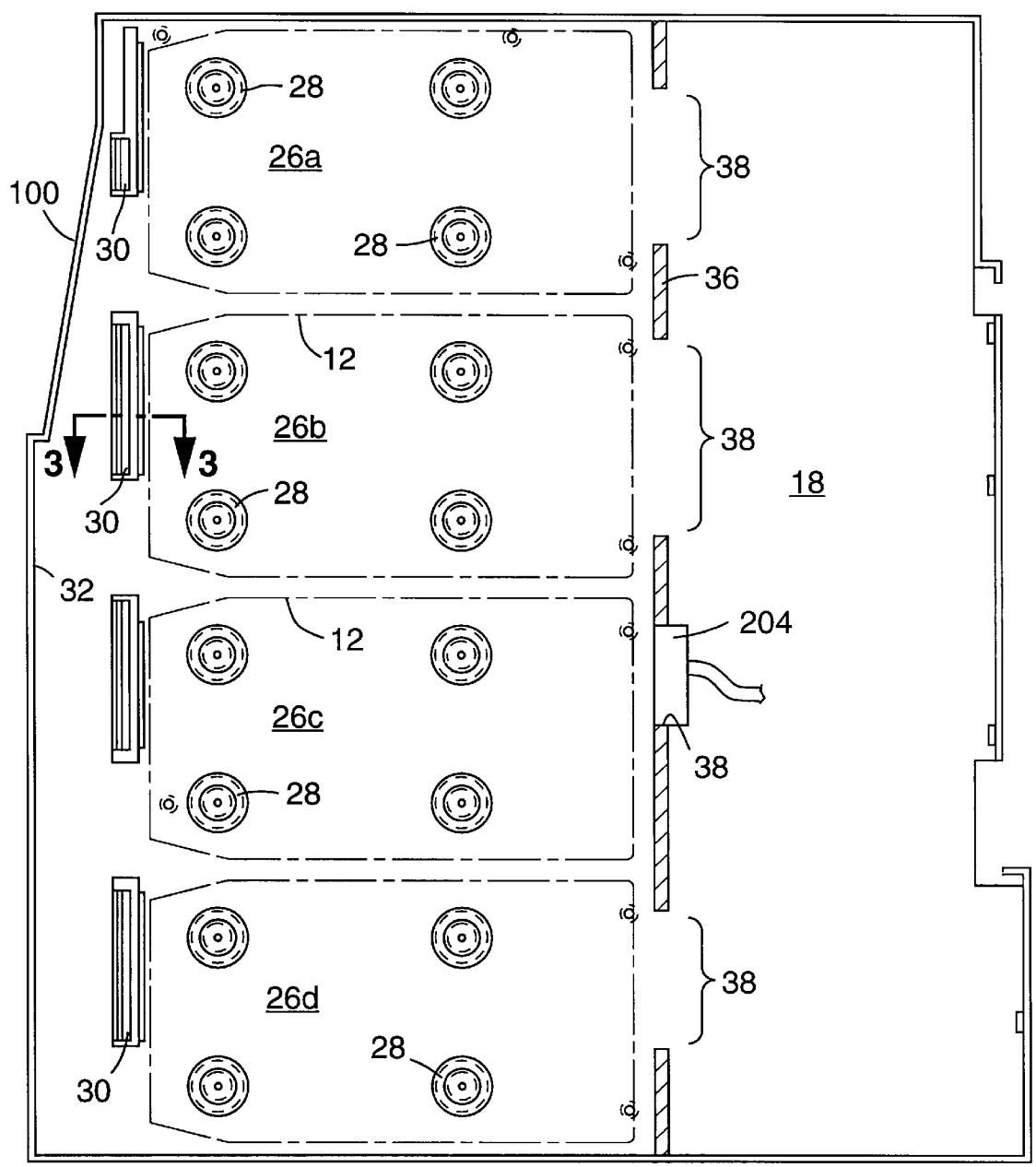
FIG. 2 is a side elevation view of a chassis wall of the mounting assembly according to the present invention inside the housing of FIG. 1. The positioning of the plates of the assembly is illustrated in dashed lines.
Figure 3:
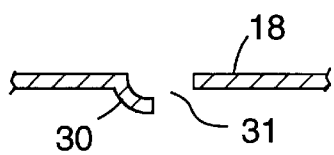
FIG. 3 is a cross-section view of the chassis wall of FIG. 2 taken along the plane designated 3—3 in FIG. 2.

A plurality of spacers 28 is mounted to the side wall 18 at each of the disk drive locations 26a–26d. Preferably, and as shown in FIG. 2, four such spacers 28 are arranged in a rectangular formation at each of the disk drive locations 26a–26d. A plurality of spring catches 30 (see also FIG. 3) are formed in the wall 18 such that there is one spring catch 30 located between each group of spacers 28 and the forward edge 32 of wall 18. As best shown in FIG. 3, each spring 30 includes a lip which extends outwardly from the wall and which includes an adjacent opening 31.

Tabs 21 (FIG. 1) extend from wall 20 at each of the disk drive locations 26a–26d. Each tab 21 includes a hole 23.

Chassis 10 is preferably formed of aluminum and is constructed for installation into an exterior housing 100 which is shown in FIG. 1. Housing 100 is configured to receive connectors (not shown) for electronically connecting disk drives installed in the chassis to other components (not shown) of a computer system. In the preferred embodiment, the spring catches 30 and openings 31 are formed by punching through the aluminum wall and pulling up a portion of the wall to form the lip.

Referring to FIG. 2, an interior wall 36 extends within the chassis between the walls 18 and 20, and includes a plurality of openings 38. During use of the invention, electrical connectors 204 (one shown in FIG. 2), which provide communication between each disk drive and the computer are disposed within these openings. These connector are positioned to mate with the connector hardware (designated 202 in FIGS. 12A–12C) extending from disk drives 200 (FIGS. 12A–12C) as such disk drives are installed into the chassis at each of the disk drive locations 26a–26d.

Figure 4:
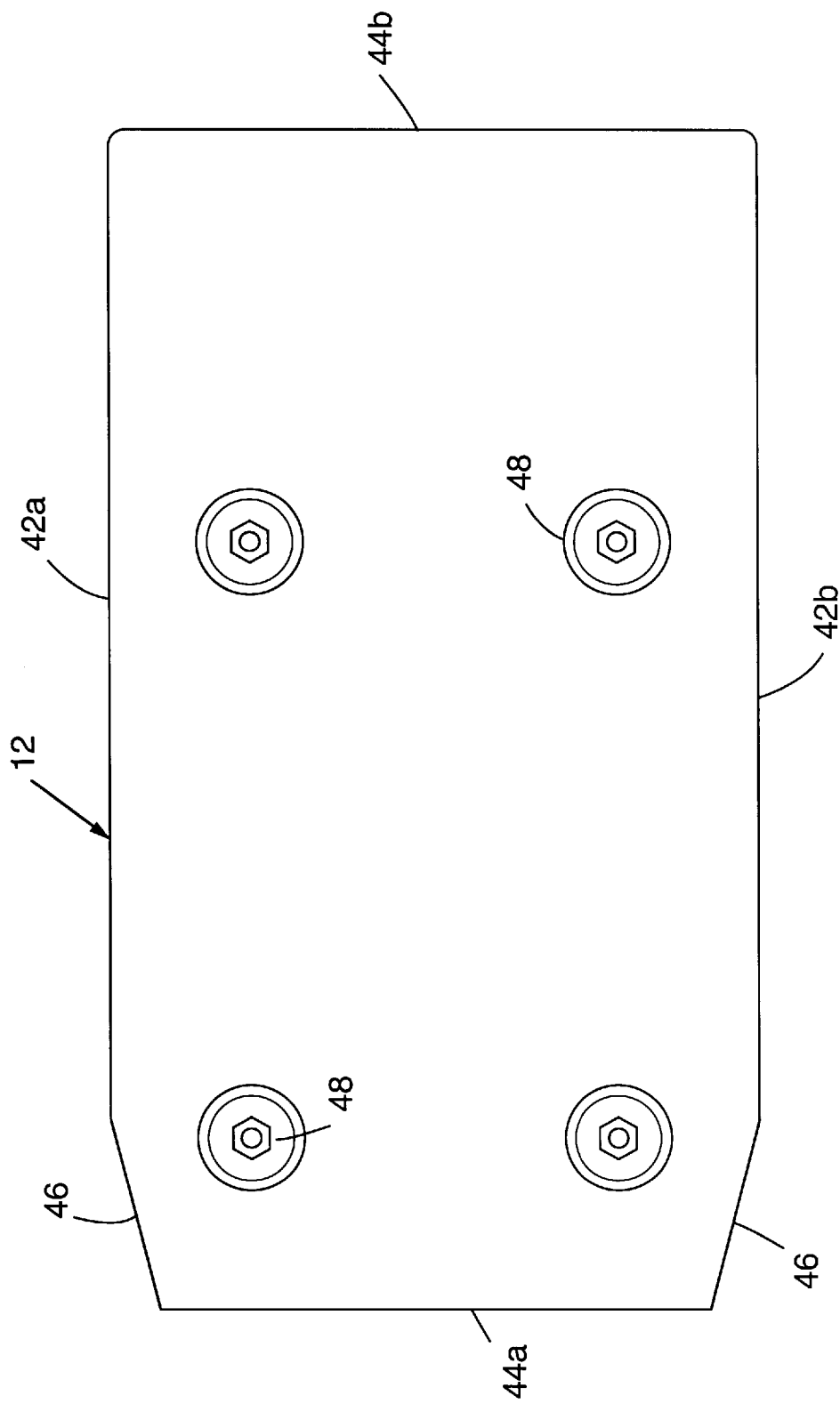
FIG. 4 is a plan view of a plate of the mounting assembly of FIG. 1.

A plan view of one of the plates 12 is shown in FIG. 4. Each plate 12 is a substantially rectangular plate having a pair of long sides 42a, 42b and pair of short sides 44a, 44b. Long sides 42a, 42b include tapered regions 46 near short side 44a.

A plurality of spacers 48 are formed on each plate 12. In a preferred embodiment, plate 12 is formed of aluminum and spacers 48 are dimples formed in the aluminum plate. Four of such plates 12 are connected to chassis wall 18, each at a separate one of the disk drive locations 26a–26d. The spacers 48 on the plates 12 are positioned to align with corresponding ones of the spacers 28 (FIG. 1) on housing wall 18 such that the plates 12 are spaced from the wall 18 as shown in FIG. 1. The plate 12 is fixedly attached to wall 18 by fixing corresponding spacers 28, 48 to one another such as by welds or fasteners.

The positioning of the plates 12 on wall 18 is indicated in dashed lines in FIG. 2. As shown, the plates 12 are positioned along wall 18 with their short sides 44a lying adjacent to corresponding ones of the spring catches 30.

Referring to FIGS. 5–7, each carrier 14 is a substantially rectangular plate preferably formed of molded plastic. Carrier 14 includes a top face 50 and a bottom face 52. Bottom face 52 includes a plurality of longitudinally extending grooves 54 and a pair of longitudinally extending side walls 56. A plurality of guide members 58 (not visible in FIG. 7) extend inwardly from side walls 56 to form longitudinally extending tracks 60 (FIG. 6) between the guide members 58 and bottom face 52. A plurality of chamfered bores 62 extend between the top and bottom faces 50, 52 of carrier 14 to allow a disk drive 200 (FIG. 11A) to be bolted to top face 50 of carrier 14.

Carrier 14 includes first and second ends 66, 67. A wall 70 extends perpendicularly from face 52 at end 66. A pair of hinge pins 68 extend laterally from wall 70. A pair of stops 72 extend substantially perpendicularly from top surface 50 of carrier 14 at end 67.

Referring to FIG. 7, each of the side walls 56 (one of which is shown in FIG. 7) includes a spring member 64 which is integrally formed with the side wall 56. The spring members 64 are adjacent to the end 66 of carrier 14.

Figure 8:
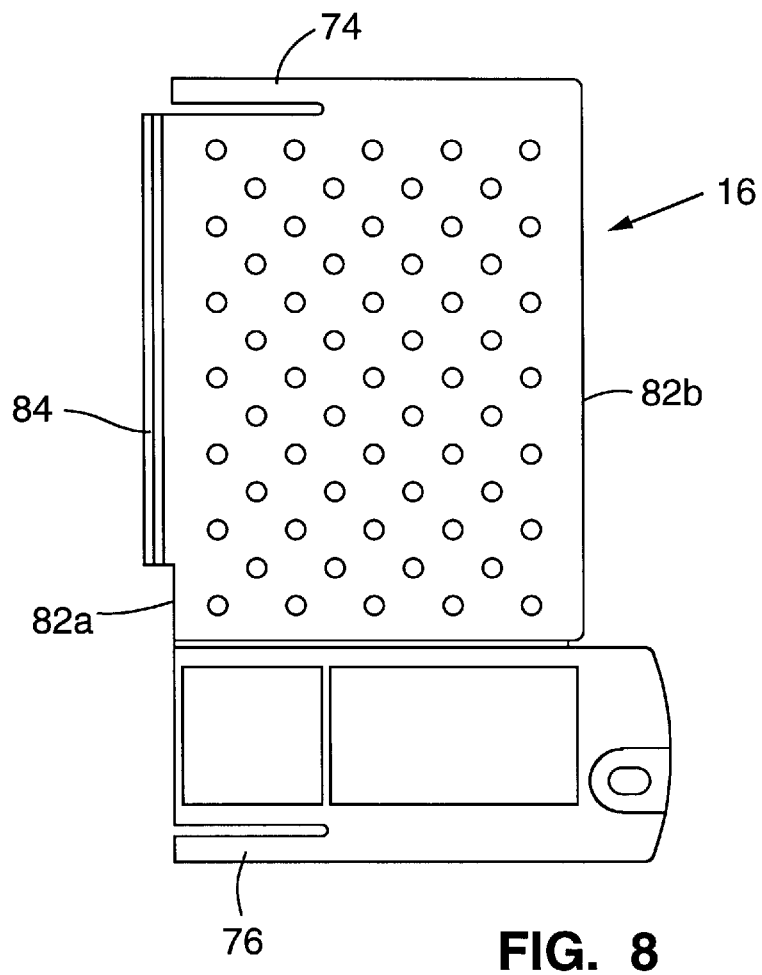
FIG. 8 is a front elevation view of the paddle of the mounting assembly of FIG. 1.

Referring to FIG. 8, paddle 16 includes a pair of upper and lower hinge members 74, 76. Each hinge member includes a rounded portion, designated 75 and 77 respectively, in FIGS. 9 and 10. Indentations 79a, 79b are formed in the rounded surfaces of the rounded portions 75, 77.

Bores 78, 80 extend through the rounded portions 75, 77. Each is proportioned to receive a corresponding one of the hinge pins 68 (see FIG. 5) on disk drive carrier 14 to form a hinged connection between carrier 14 and paddle 16 (see FIGS. 11A and 11B).

Figure 9:
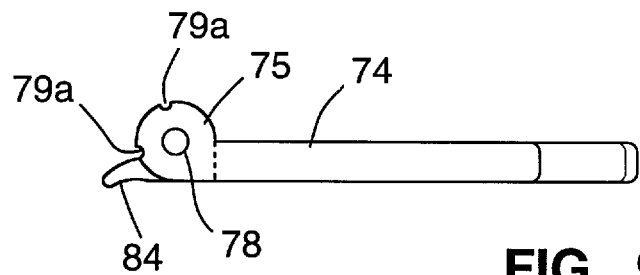
FIGS. 9 and 10 show the top and bottom, respectively, of the paddle shown in FIG. 8.
Figure 10:
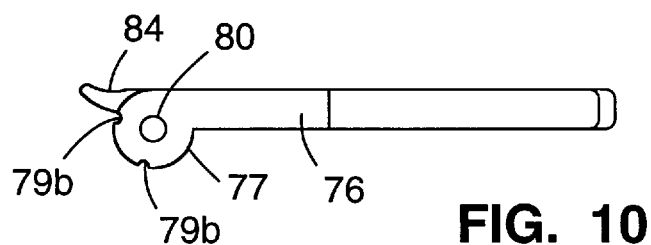

Referring again to FIG. 8, paddle 16 is substantially rectangular and includes a pair of long sides 82a, 82b. Extending laterally from long side 82a is a latch member 84 which, as can be seen in FIGS. 9 and 10, bends slightly away from the hinge members 74, 76.

Figure 11A:
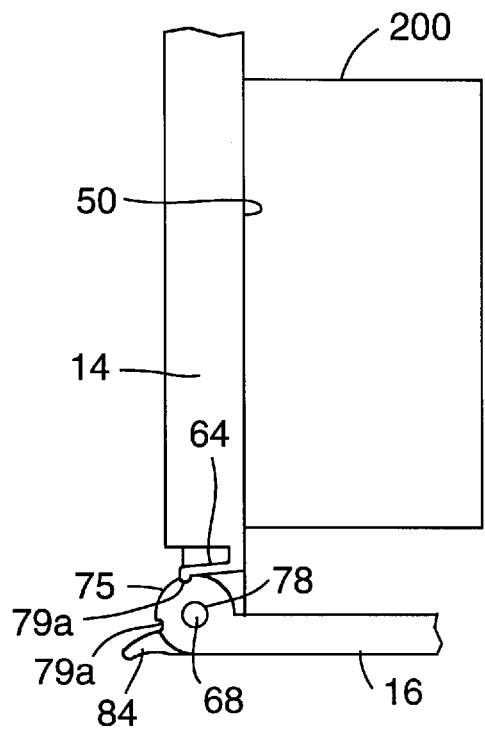
FIGS. 11A and 11B are side elevation views of the hinged connection between the carrier and paddle.
Figure 11B:
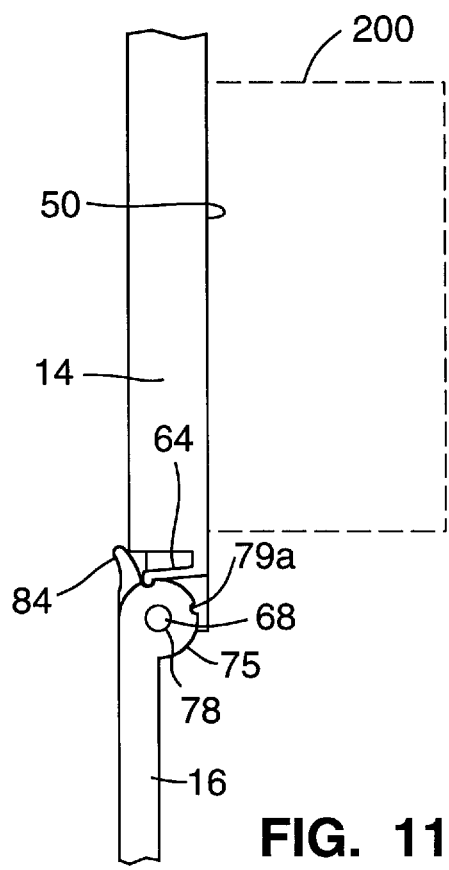

FIGS. 11A–11B show the hinged connection between paddle hinge member 74 and carrier 14. Hinge member 76 (FIG. 10) is similarly connected to carrier 14. Hinge pins 68 on carrier 14 extend through bores 78 to provide a hinged connection between the carrier 14 and the paddle 16. Paddle 16 is pivotable with respect to carrier 14 about hinge pins 68 between an opened condition, shown in FIG. 11B, and a closed condition shown in FIG. 11A.

When carrier 14 and paddle 16 are hinged together, the spring members 64 on carrier 14 rest against the rounded surface 75, 77 (surface 77 not shown in FIGS. 11A, 11B but see FIG. 10) of the hinge members 74, 76. Indentations 79a, 79b provide resting places for the spring members 64 and thereby prevent the paddle 16 from falling between opened and closed positions with respect to the carrier 14 when such movement is not initiated by a user.

A disk drive 200 is secured to top face 50 of carrier 14. Installation of the disk drive 200 into the chassis 10 is accomplished by sliding carrier 14, which supports the disk drive 200, into the chassis. A series of steps illustrating installation of carrier 14 into the housing 10 is shown in FIGS. 12A–12D.

Figure 12A:
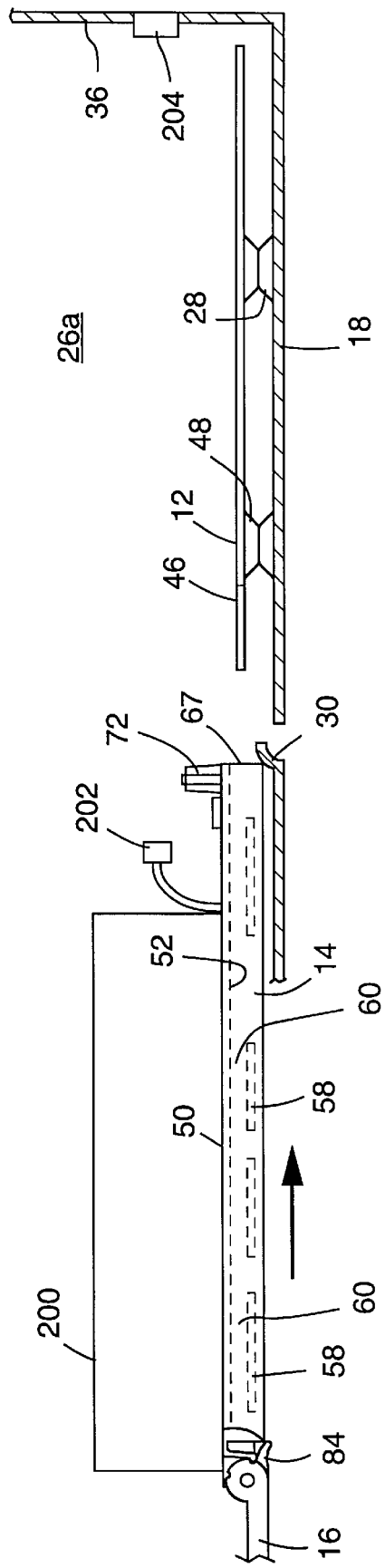
FIGS. 12A through 12C are cross-section views of the chassis of FIG. 1 taken along the plane designated 12A—12A in FIG. 1, showing insertion of a disk drive into the chassis. For simplicity, the housing is not shown.
Figure 12B:
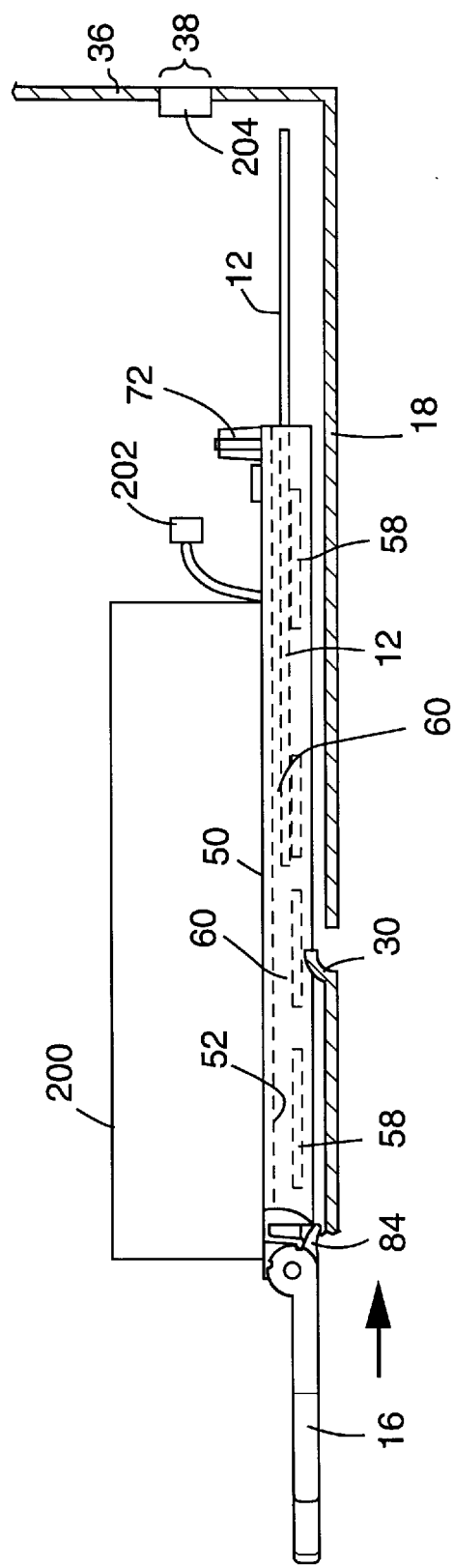

Referring to FIG. 12A, with the paddle 16 in the opened condition with respect to carrier 14, carrier 14 is introduced into chamber 26 such that end 67 of carrier 14 enters the chamber first. Referring to FIG. 12B, proper alignment of carrier 14 within the chassis is ensured by sliding carrier 14 such that plate 12 within the chassis is disposed between bottom face 52 of carrier 14 and guide members 58 (i.e., such that the plate 12 is disposed within tracks 60 formed between guide members 58 and bottom face 52). As the disk drive 200 reaches its fully inserted condition, disk drive connector 202 mates with corresponding connector 204 disposed in opening 38. Once the disk drive 200 is fully within chamber 26, stops 72 on the top face 50 of the carrier collide with interior wall 56 of the chassis (FIG. 12C), indicating to the user that the disk drive 200 is fully installed.

Figure 12C:
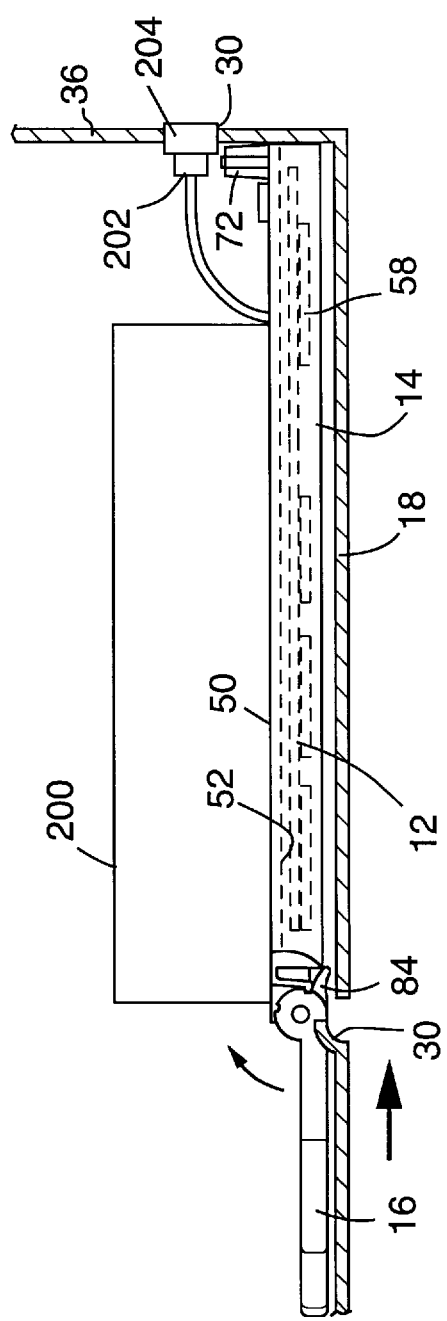
Figure 12D:
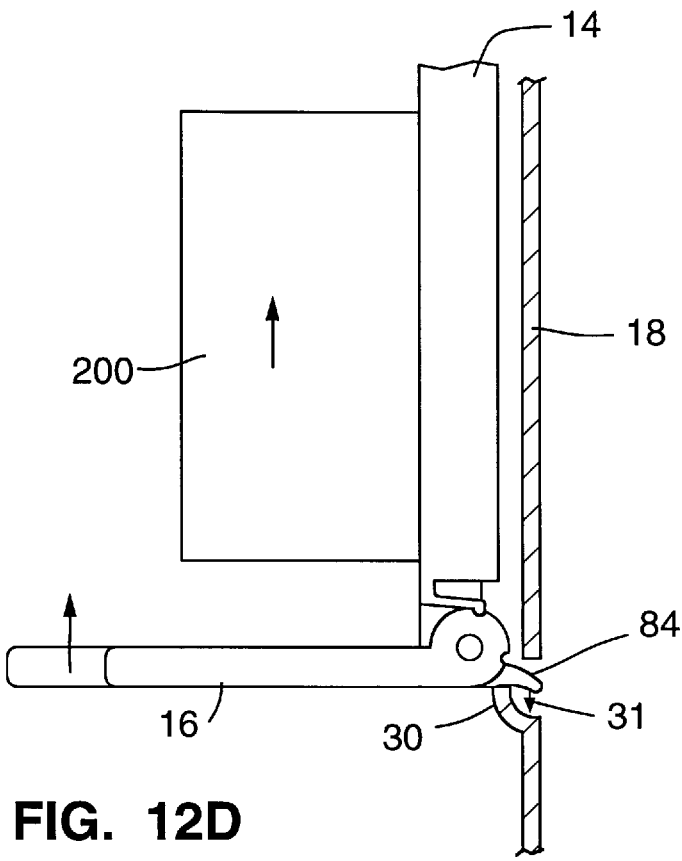
FIG. 12D is a top elevation view of the mounting assembly of FIGS. 12A–12C, illustrating engagement between the paddle latch member and the chassis wall catch during rotation of the paddle to the closed condition.

At this point, latch member 84 of the paddle 16 has advanced slightly beyond the opening 31 of spring catch 30 on the side wall 18 of the chamber. Referring to FIGS. 12C and 12D, paddle 16 is rotated from the opened condition to the closed condition, causing latch member 84 to fall into opening 31 at spring 30, thereby locking disk drive 200 in place.

As illustrated by arrows in FIG. 12D, as paddle 16 is rotated, latch member 84 may cam against spring 30 if the latch member 84 has not been advanced far enough into the chassis to be beyond opening 31. In such instances, the camming action of latch member 84 against spring catch 30 causes carrier 14 and disk drive 200 to be propelled slightly forward by a small amount until the latch member 84 springs into the opening 31.

Disk drive 200 may be further secured in place by passing a screw 86 (FIG. 1) through the hole in paddle 16 and further through the hole 23 in that tab 21 on wall 20 of the chassis.

Figure 12E:
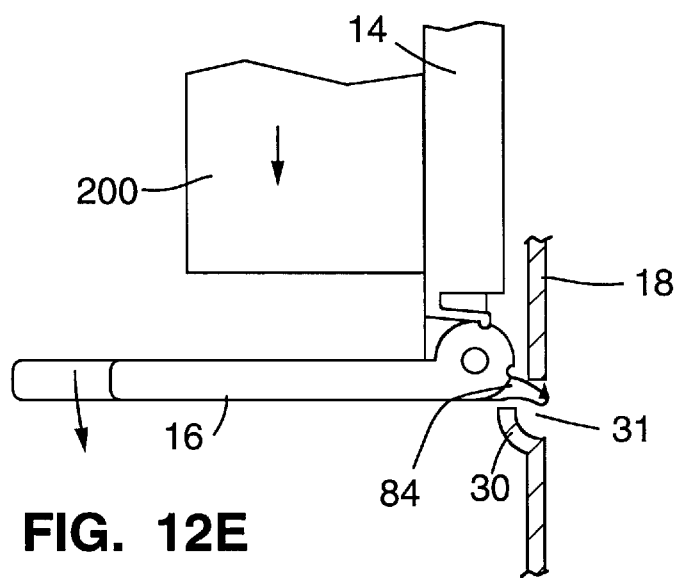
FIG. 12E is a top elevation view similar to FIG. 12D, illustrating disengagement of paddle latch member from the chassis wall spring catch as the paddle is rotated to the opened condition.

To remove a disk drive from the chassis, screw 86 is removed and paddle 16 is pivoted to its opened condition. Referring to FIG. 12E, as paddle 16 is pivoted to its opened condition, latch member 84 abuts a portion of wall 18 within opening 31, causing slight outward movement of the carrier 14 and disk drive 200. This disengages latch member 84 from spring catch 30. Once paddle 16 reaches the opened condition (FIG. 11B), carrier 14 and paddle 16 are then withdrawn from the chamber 26.

Although a preferred embodiment of a mounting assembly for electronic components has been described herein, many others are possible according to the present invention. The scope of the present invention is not intended to be limited to the specific embodiment described above but is rather defined by the claims recited below.

What is claimed is:

1. A mounting assembly for removably mounting an electronic component into a housing, comprising:

a housing having a wall;

a catch formed in the wall, the catch including a spring member having a first end attached to the wall and a second end separated from the wall thereby defining an opening between the second end and the wall;

a plate fixedly mounted in spaced relation to the wall;

an electronic component carrier slidably mountable to the plate, the carrier having a fully removed condition in which the carrier is separated from the plate and an installed condition in which the carrier is mounted to the plate and is within the housing;

a latch member hinged to the carrier, the latch member pivotable relative to the carrier between an opened condition in which the latch member extends longitudinally from the carrier and a closed condition in which the latch member extends angularly from the carrier, wherein the latch member is engaged with the catch when the carrier is moved into the installed condition and the latch member is pivoted to the closed condition, wherein the latch member is shaped and positioned so that when the carrier has been translated in a first direction from the fully removed condition into the installed condition, pivoting of the latch member causes said latch member to cam against the catch and thereby move the carrier further in the first direction until the latch member has pivoted into the closed condition, and wherein, when the carrier is in the installed condition and the latch member has pivoted into the closed condition, the latch member has an end portion positioned in the opening.

* * * * *